(12) United States Patent
Chang et al.

(10) Patent No.: US 8,090,394 B2
(45) Date of Patent: Jan. 3, 2012

(54) DYNAMIC PATTERN ELIMINATION BASED COMPRESSION METHOD FOR TEXT-BASED SIGNALING PROTOCOLS

(75) Inventors: Shih-Chun Chang, Sunrise, FL (US); Siddhardha Garige, Sunrise, FL (US); Sreekant Nair, Sunrise, FL (US); Hai Vu, Richardson, TX (US)

(73) Assignee: XG Technology, Inc., Sarasota, FL (US)

( * ) Notice: Subject to any disclaimer, the term of this patent is extended or adjusted under 35 U.S.C. 154(b) by 57 days.

(21) Appl. No.: 12/803,380

(22) Filed: Jun. 25, 2010

(65) Prior Publication Data
US 2011/0003604 A1  Jan. 6, 2011

Related U.S. Application Data

(60) Provisional application No. 61/269,951, filed on Jul. 1, 2009.

(51) Int. Cl.
*H04W 4/00* (2009.01)

(52) U.S. Cl. .............................. 455/466; 704/10; 710/68
(58) Field of Classification Search ................. 455/466; 710/68; 379/88.1
See application file for complete search history.

(56) References Cited

U.S. PATENT DOCUMENTS

| | | |
|---|---|---|
| 2003/0091189 A1 | 5/2003 | Rhoads |
| 2007/0136492 A1 | 6/2007 | Blum et al. |
| 2009/0271181 A1* | 10/2009 | Balegar et al. ................. 704/10 |

* cited by examiner

*Primary Examiner* — Charles Shedrick
(74) *Attorney, Agent, or Firm* — Dennis L. Cook, Esq.

(57) ABSTRACT

This disclosure describes a dynamic pattern elimination compression method to eliminate redundant patterns, the content of which is not known a priori, by identifying the candidate dynamic patterns and marking them, then checking to see if there are any duplicate occurrences within the entire message by searching for markers, if a marker is found, checking to see if the pattern occurred before, if not, assigning a unique variable to the pattern, if so replacing the pattern with the variable that was assigned for this pattern, and if a pattern is found only once, removing the variable assigned to it.

1 Claim, 2 Drawing Sheets

Original Message

INVITE sip:19991234567@111.222.333.444 SIP/2.0

Record-Route: <sip:10.17.0.13;lr=on>

Via: SIP/2.0/UDP 10.17.0.13:25042;branch=z9hG4bK5f14.654e49a7.0

Via: SIP/2.0/UDP 10.17.0.13:25002;branch=z9hG4bK53e63bca648c5338a4cbf459;rport=5060

Max-Forwards: 69

From: "170107150003" <sip:170107150003@111.222.333.444>;tag=1f7bae8

To: <sip:19991234567@111.222.333.444>

Contact: <sip:170107150003@10.17.0.13:25002>

Figure 1. Original Message

```
INVITE sip:19991234567@111.222.333.444 SIP/2.0
Record-Route: <sip:10.17.0.13;lr=on>
Via: SIP/2.0/UDP 10.17.0.13:25042;branch=z9hG4bK5fl4.654e49a7.0
Via: SIP/2.0/UDP 10.17.0.13:25002;branch=z9hG4bK53e63bca648c5338a4cbf459;rport=5060
Max-Forwards: 69
From: "170107150003" <sip:170107150003@111.222.333.444>;tag=1f7bae8
To: <sip:19991234567@111.222.333.444>
Contact: <sip:170107150003@10.17.0.13:25002>
```

Figure 2. Message with Markers

```
INVITE sip:^19991234567^@^111.222.333.444^ SIP/2.0
Record-Route: <sip:^10.17.0.13^;lr=on>
Via: SIP/2.0/UDP ^10.17.0.13^:25042;branch=z9hG4bK5fl4.654e49a7.0
Via: SIP/2.0/UDP ^10.17.0.13^:25002;branch=z9hG4bK53e63bca648c5338a4cbf459;rport=5060
Max-Forwards: 69
From: ^170107150003^ <sip:^170107150003^@^111.222.333.444^>;tag=1f7bae8
To: <sip:^19991234567^@^111.222.333.444^>
Contact: <sip:^170107150003^@^10.17.0.13^:25002>
```

Analyze dynamic patterns for compression

Figure 3.

INVITE sip:^19991234567A@^111.222.333.444B SIP/2.0

Record-Route: <sip:10.17.0.13;lr=on>

Via: SIP/2.0/UDP ^10.17.0.13D:25042;branch=z9hG4bK5f14.654e49a7.0

Via: SIP/2.0/UDP D:25002;branch=z9hG4bK53e63bca648c5338a4cbf459;rport=5060

Max-Forwards: 69

From: ^170107150003E <sip:E@B>;tag=1f7bae8

To: <sip:A@B>

Contact: <sip:E@D:25002>

Figure 4. Mapping table between variables and patterns

| Variable | String Pattern |
| --- | --- |
| A | 19991234567 |
| B | 111.222.333.444 |
| D | 10.17.0.13 |
| E | 170107150003 |

DYNAMIC PATTERN ELIMINATION BASED COMPRESSION METHOD FOR TEXT-BASED SIGNALING PROTOCOLS

CROSS-REFERENCE TO RELATED APPLICATION

The present application claims the benefit of previously filed Provisional Patent Application, Ser. No. 61/269,951.

FIELD OF THE INVENTION

This invention addresses the need to transport high bit-rate text to multiple users over wired and wireless means. Specifically, this disclosure describes a dynamic pattern elimination compression method to eliminate redundant patterns, the content of which is not known a priori.

BACKGROUND OF THE INVENTION

Any text-based protocol would have predefined keywords with special purposes that are agreed between parties to communicate with each other. A trivial way used to reduce the size of messages is to use shorter forms to replace those long, predefined keywords. However, there may still be text patterns that are repeated or redundant in a message.

The existing technologies of text-based compression can be categorized into two different groups. One is dictionary-based and another one is to use a standard compression algorithm such as Huffman codes. Dictionary-based techniques usually use static dictionaries that are created before transmission of a message and/or dynamic dictionaries that are included in the message. Those techniques include U.S. Ser. No. 6,976,081, U.S. Ser. No. 5,999,949, U.S. Ser. No. 7,412,541, U.S. Ser. No. 6,807,173, U.S. Ser. No. 6,883,035, and U.S. Ser. No. 6,976,081. Replacing the longer words with a shorter form is a simple example of using a static dictionary at both the compressor and the decompressor. This disclosure proposes a method, Dynamic Pattern Elimination, to eliminate redundant patterns the content of which is not known a priori. The proposed method identifies the redundant patterns on the fly and does not require any dictionary.

BRIEF SUMMARY OF THE INVENTION

This invention addresses the need to transport high bit-rate text to multiple users over wired and wireless means. Specifically, this disclosure describes a dynamic pattern elimination compression method to eliminate redundant patterns, the content of which is not known a priori.

For a fuller understanding of the nature and objects of the invention, reference should be made to the following detailed description taken in connection with the accompanying drawings.

DESCRIPTION OF THE DRAWINGS

For a fuller understanding of the nature and objects of the invention, reference should be made to the accompanying drawings, in which:

FIG. 1 is an example of a partial SIP message;
FIG. 2 is an example of a partial SIP message with markers;
FIG. 3 is an example of a compressed SIP message; and
FIG. 4 is a table describing the mapping between variables and patterns.

DETAILED DESCRIPTION OF THE INVENTION

This disclosure describes a method to achieve a higher compression ratio than by just replacing known longer patterns with shorter forms. The preferred embodiment is specifically designed for a wireless environment as a wireless link is prone to errors. With a smaller message size, one has a higher probability of successful transmission as well as reduced latency over the wireless link.

The basic idea is to identify duplicate patterns that cannot be known before hand. However, those patterns and the location may be predicated. Therefore, one uses a regular expression to identify the candidate patterns at the first stage, and remove duplicate patterns in the next stage. In this disclosure SIP signaling protocol is used as the preferred embodiment to illustrate the compression method.

In order to remove duplicate dynamic patterns, one first needs to identify them. This is done by inserting a marker before a candidate pattern so that it can be analyzed later. Note that the representation of markers is chosen such that they would not appear in normal SIP messages. Examples and the notations shown in this document are for preferred embodiment purposes only and other notations can be easily substituted by those skilled in the art. After analyzing characteristics of SIP messages, the inventors of this application found the IP address and User name patterns have a higher probability of being repeated at several points within a message. For example, below are regular expressions to identify and insert markers for IP address and user name:

IP address—s/([:;\"@])([0-9\.]+)([:;\">]|\r)∧1^\2~\3/g

User name—s/([:\"])([a-zA-Z0-9\.]+)([\"@])
∧1^\2~\3/g

Note that additional identifications of dynamic patterns could be added later as discussed below. FIGS. 1 and 2 show an example of a partial SIP message before and after markers are inserted.

After identifying the candidate dynamic patterns, one checks to see if there are any duplicate occurrences within the entire message using the following steps.
1. Search for markers
2. If a marker is found, check if the pattern occurred before.
3. If not, assign a unique variable to the pattern, otherwise, replace the pattern with the variable that was assigned for this pattern.
4. If a pattern is found only once, remove the variable assigned to it.

An example of a compressed message is shown in FIG. 3 and a mapping table between variables and patterns is shown in FIG. 4.

At the decompressor, one only needs to find the markers and restore each pattern corresponding to a marker. A special marker, ^ in the example above, is used to indicate the beginning of a pattern and the corresponding variable. By doing so, the decompressor is able to reconstruct the mapping between variables and patterns. If the decompressor finds the variable in the message, it could replace it with the pattern it found. As the purpose of a marker is to identify possible duplicate patterns, we could add identification of dynamic patterns later without breaking compatibility because the additional markers are inserted by the compressor, and the decompressor could still decompress the message with additional markers.

This application disclosed a general approach to eliminate duplicate patterns in text-based protocol. The regular expression is used to identify candidate patterns to be removed. Then one examines the message for special markers and variables to compress and decompress the message. The advantages of this method include:

a) Detection of the duplicate patterns on the fly without knowing the actual patterns.

b) Forward compatibility. One is able to add an additional regular expression to identify more patterns with prior version of implementation.

c) It's a generic solution for text-based protocols.

Since certain changes may be made in the above described dynamic compression method for text based signaling protocols without departing from the scope of the invention herein involved. It is intended that all matter contained in the description thereof, or shown in the accompanying figures, shall be interpreted as illustrative and not in a limiting sense.

What is claimed is:

1. A text message transmission and receiving device for compressing, transmitting, and decompressing text based signaling protocols of a text message with regularly occurring dynamic patterns where such dynamic patterns are not known in advance comprising:

a transceiver compressing a text message by first inserting markers that are represented by characters not normally used in the text based signaling protocols of a text message to be transmitted where any candidate dynamic patterns are found;

then searching the text based signaling protocols of the text message for markers and when a marker is found determining if the candidate dynamic pattern has occurred before;

then if said candidate dynamic pattern has not occurred before assigning said candidate dynamic pattern with a unique variable not normally used in the text based signaling protocols of the text message to be transmitted;

then if said candidate dynamic pattern has occurred before replacing said repeating candidate dynamic pattern with said unique variable that was assigned to said candidate dynamic pattern before;

then if said candidate dynamic pattern is found only once in the text based signaling protocols of the text message to be sent removing said unique variable assigned to it resulting in a text message where one candidate dynamic pattern remains in the text message and is identified by the unique variable and the repeating candidate dynamic patterns are removed from the text message and replaced with the unique variable;

then transmitting the text message to a second transceiver; and, said second transceiver receiving said text message and decompressing said text message by searching said text based signaling protocols of the text message that was received and identifying each unique variable and corresponding one candidate dynamic pattern remaining in the text message with the identified unique variable and then replacing each additional said unique variable found with the corresponding candidate dynamic pattern said unique variable replaced.

* * * * *